(12) United States Patent
Tran et al.

(10) Patent No.: US 6,437,627 B1
(45) Date of Patent: Aug. 20, 2002

(54) HIGH VOLTAGE LEVEL SHIFTER FOR SWITCHING HIGH VOLTAGE IN NON-VOLATILE MEMORY INTERGRATED CIRCUITS

(75) Inventors: Hieu Van Tran, San Jose; Trevor Blyth, Milpitas, both of CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 08/519,396

(22) Filed: Aug. 25, 1995

(51) Int. Cl.[7] ................................................. H03L 5/00
(52) U.S. Cl. ........................ 327/333; 327/319; 327/333; 327/309; 327/318; 327/320

(56) References Cited

U.S. PATENT DOCUMENTS

| | | | | |
|---|---|---|---|---|
| 4,490,629 A | * | 12/1984 | Barlow et al. | 307/451 |
| 5,170,078 A | * | 12/1992 | Hsueh et al. | 307/451 |
| 5,477,180 A | * | 12/1995 | Chen | 327/108 |
| 5,550,501 A | * | 8/1996 | Ito et al. | 327/112 |

* cited by examiner

Primary Examiner—Jeffrey Zweizig
(74) Attorney, Agent, or Firm—Blakely, Sokoloff, Taylor & Zafman LLP

(57) ABSTRACT

A high voltage level shifter utilizing only low voltage PMOS and low voltage NMOS devices. The high voltage level shifter is used to distribute the high voltage almost equally among the PMOS devices and almost equally among the NMOS devices to meet the device electrical specification of low voltage MOS devices for various breakdown mechanisms. A layout technique is also used to achieve a much higher junction breakdown of N+ drain to P-substrate and a better gated diode breakdown of NMOS devices.

30 Claims, 3 Drawing Sheets

HIGH VOLTAGE LEVEL SHIFTER FOR SWITCHING HIGH VOLTAGE IN NON-VOLATILE MEMORY INTERGRATED CIRCUITS

BACKGROUND OF THE INVENTION

1. Field of the Invention

The present invention relates to the field of CMOS Integrated Circuits, specifically circuits for switching high voltages on chip in non-volatile memory integrated circuits.

2. Prior Art

Integrated circuits which operate with two or more power supplies invariably require signals to interface between sections of the circuit supplied by different power supply voltages. Multiple power supply voltages may be supplied from external power sources, or, in the case of several classes of integrated circuits such as non-volatile memories, watch circuits and display drivers, may be generated internally or on-chip from a single power source. However, the voltage range over which a signal swings is often incompatible with other sections of the circuit. For example, logic signals with a smaller voltage swing than the circuits to be controlled, may violate the maximum low levels or minimum high levels required by said circuits. In the case of CMOS integrated circuits, violation of the logic signals may result in malfunction of the circuit due to unrecognizable logic signal levels, and also in simultaneous conduction of PMOS and NMOS devices, thereby increasing the operating current of the circuit. Signals generated from a higher supply than the circuit to be controlled may also cause malfunction. As an example, if a high voltage signal is routed in diffusion into a low voltage region of an integrated circuit, the integrated circuit may be driven into SCR latchup. A level shifter solves the latchup problem by converting or shifting its output signal to a voltage range different than the voltage range of its input signal.

FIG. 1 illustrates a typical prior art high voltage level shifter. Referring to FIG. 1, a low voltage logic signal is applied to input node IN, which is also applied to the gates of P-channel and N-channel devices N1, N3, and P3. This may be, by way of example, a 0 to 2.5 volt logic signal. The inverse of the input signal, INB, which is created by the inverter pair N3 and P3, is applied to the gate of device N2. Pull-up P-channel devices P1 and P2 have their substrates and sources coupled to high voltage supply VHV. Signals IN, INB and the sources of devices N1 and N2 are referenced to the same node, VSS. One of the N-channel devices, N1 or N2, is in the conductive state while the other is in the non-conductive state, depending on the polarity of input signal IN. The conducting device pulls its drain voltage to VSS, and since the drain is connected to the gate of the opposite P-channel device P1 or P2, the P-channel device enters the non-conductive state. Consequently, due to the cross coupled configuration, one side of the level shifter is pulled low, turning on the opposite pull-up device to pull the other side high as referenced to VHV.

During the transition period, when the level shifter is changing from one stable state to the other, a charging current and a simultaneous conduction current passes through the P-channel devices P1 and P2 and N-channel devices N1 and N2. However, with correct design of device dimensions, the level shifter nodes continue to change voltage until output nodes HVOUT and HVOUTB are at opposite potentials, one at high voltage supply level VHV and the other at VSS. In the stable state, there is no current through either of the two current paths, P1/N1 or P2/N2, because one pair has VSS on the gate of the N-channel device, holding it off, while the other pair has high supply voltage VHV on the gate of the P-channel device, holding it off also.

The P-channel devices P1 and P2 of the level shifter of FIG. 1 are potentially subjected to gated diode breakdown, BVDP, and P+ drain to n-well junction breakdown, BVJP, at their drains. The N-channel devices N1 and N2 of FIG. 1 are also potentially subjected to gated diode breakdown, BVDN, and N+ drain to P-substrate junction breakdown, BVJN. To avoid such breakdown, all the breakdown voltages are required to be larger than high supply voltage VHV, i.e., 21 volts in the example given. To accomplish this, special high voltage process steps, such as using double diffusion junctions on the source and the drain of the high voltage P-channel devices P1 and P2 and high voltage N-channel devices N1 and N2, are used to minimize the electric field across the source and drain junctions. Such special high voltage steps are generally undesirable.

BRIEF SUMMARY OF THE PRESENT INVENTION

A high voltage level shifter utilizing only low voltage PMOS and low voltage NMOS devices. The high voltage level shifter is used to distribute the high voltage almost equally among the PMOS devices and almost equally among the NMOS devices to meet the device electrical specification of low voltage MOS devices for various breakdown mechanisms. A layout technique is also used to achieve a much higher junction breakdown of N+ drain to P-substrate and a better gated diode breakdown of NMOS devices.

DETAILED DESCRIPTION OF THE PRESENT INVENTION

A method and apparatus for a high voltage level shifter utilizing only low voltage P-channel and N-channel devices is described.

Figure 1:
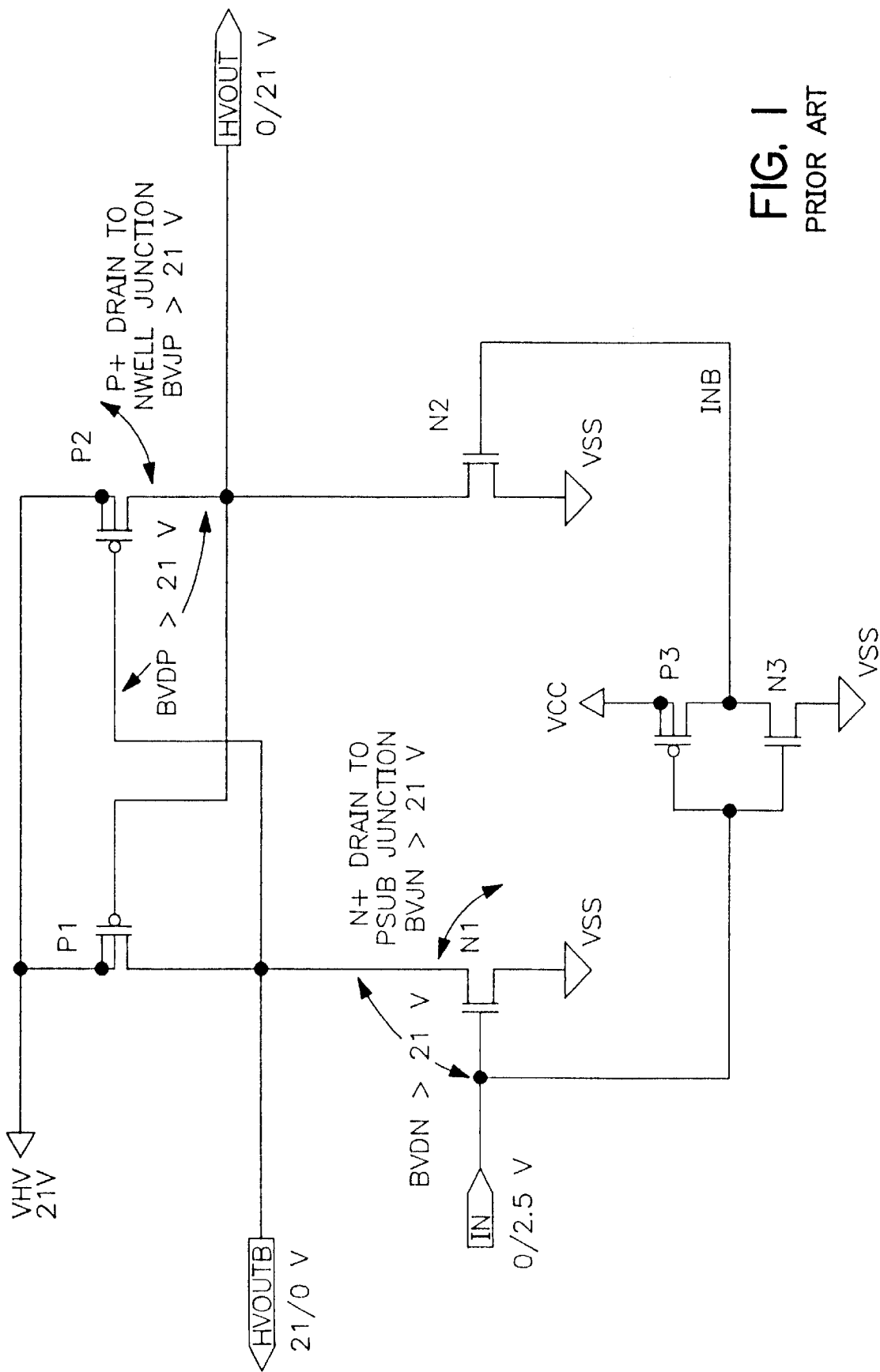
FIG. 1 is a circuit diagram for a typical prior art high voltage level shifter using MOS technology.
Figure 2:
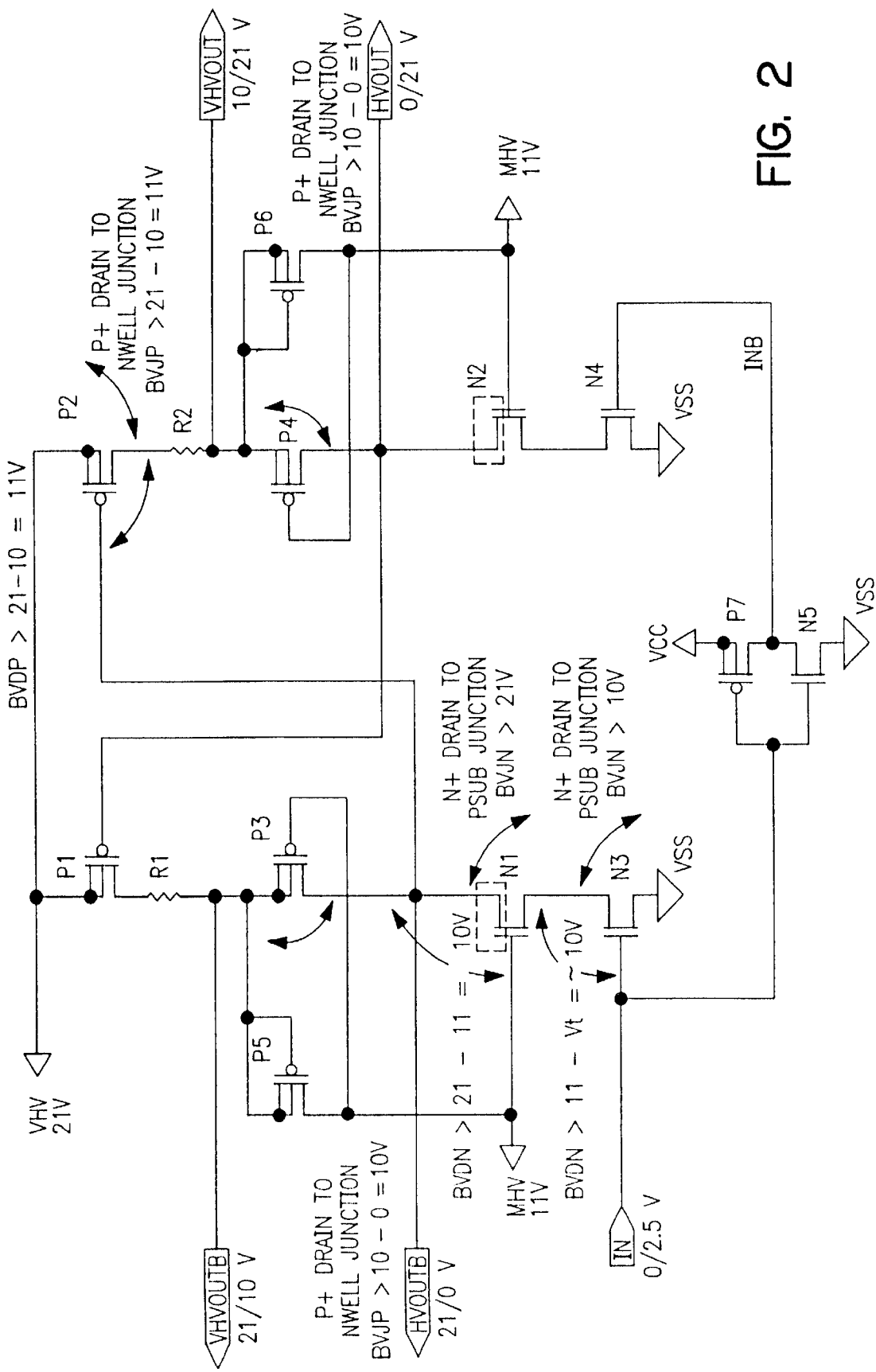
FIG. 2 is a circuit diagram for the preferred embodiment of the present invention.

FIG. 2 is a circuit diagram for a preferred embodiment of the present invention. In this circuit, the P-channel devices are labeled as P1, P2, P3, P4, P5, P6 and P7 respectively. Similarly, the N-channel devices are labeled N1, N2, N3, N4 and N5 respectively. A very high voltage source, VHV, is the operating high voltage, in the preferred embodiment typically 21 volts. A medium high voltage source, MHV, is an intermediate level shift voltage, in the preferred embodiment typically 11 volts. A third voltage source, VSS, is the operating low voltage, in the preferred embodiment typically 0 volts. The input signal IN has an input voltage either equal to VSS or a level above VSS. However, in another embodiment, the input signal may be referenced to VHV and is either equal to VHV or a level below VHV. Referring again to FIG. 2, HVOUT and HVOUTB are complementary low/high voltage outputs of 0 or 21 volts and VHVOUT and VHVOUTB are complementary medium/high voltage outputs of 10 or 21 volts.

The medium high voltage source, MHV, distributes the very high voltage source, VHV, approximately equally across the pair of P-channel devices P2/P4 and across the pair of N-channel devices N1/N3, or across the pair of P-channel devices P1/P3 and across the pair of N-channel devices N2/N4. In addition, the voltage level of MHV is chosen to not violate any breakdown mechanism of the P-channel devices P1–P4 and N-channel devices N3 and N4.

P-channel devices P5 and P6 are optional and provide for the junction leakage of P-channel devices P3 and P4 respectively to stabilize the sources of P3 and P4 at about 10 volts. As is apparent to one skilled in the art, P-channel devices P5 and P6 could be replaced with a pair of diodes with the cathodes coupled to VHVOUTB and VHVOUT, respectively, and the anodes coupled to MHV. Resistors R1 and R2 reduce the switching currents of the circuit. It will be apparent to one skilled in the art that in one embodiment R1 and R2 may not be needed, and in another embodiment R1 and R2 may be replaced by some other current limiting device or circuit. The P7 and N5 device inverter pair provide necessary inversion control of the input signal IN.

Referring to FIG. 2, the signal IN provides the low voltage input into the high voltage level shifter circuit. In response, the P7 and N5 device inverter pair, supplied by VCC and VSS, provide the necessary inversion of the input signal IN to provide the signal INB. In the preferred embodiment, IN is typically between 0 and 2.5 volts. However, in another embodiment, IN may be, by way of example, between 0 and 5 volts. Typically, VCC is between 2.5 and 5 volts.

Referring again to FIG. 2, a logic 0 applied to input node IN creates a logic high or VCC at node INB due to the inverter pair P7 and N5. IN and INB are simultaneously coupled to the gates of N3 and N4 respectively. As a result, N4 turns on (goes into a conductive state) and pulls its drain down to VSS. With N2 also being turned on, the drain of N2 or HVOUT is pulled low to VSS or 0 volts. Since the drain of N2 is cross coupled to the gate of P1, the opposite device, P1 turns on causing VHVOUTB to be pulled up to VHV or 21 volts. with VHVOUTB at 21 volts and coupled to the source of P3, P3 turns on further, causing the output HVOUTB to also be pulled up to 21 volts.

Continuing to refer to FIG. 2, with the input IN at 0 volts at the gate of N3, N3 is turned off (goes into a non-conductive state), thus isolating the output HVOUTB from VSS. Since HVOUTB is cross coupled to the gate of P2 and is at 21 volts, P2 also turns off and isolates VHVOUT from VHV. As a result, P4 turns on until VHVOUT is one P-channel threshold above MHV, then P6 turns on to hold the output VHVOUT to about 10 volts. Thus, since the high voltage level shifter circuit is symmetrical, an inverted signal applied to input node IN causes the outputs HVOUT and VHVOUT to be pulled up to VHV or 21 volts, the output HVOUTB to be pulled down to VSS or 0 volts, and the output VHVOUTB to be at about 10 volts.

When the input IN is a logic low or 0 volts, P2 has its source at 21 volts, its gate at 21 volts, and its drain at 10 volts. The gate to drain voltage of P2 is 11 volts and the P+ drain to n-well junction voltage of P2 is 11 volts. P4 has its source at 10 volts, gate at 11 volts, and drain at 0 volts. The gate to drain voltage of P4 is 11 volts and the P+ drain to n-well junction voltage of P4 is 10 volts. N1 has its source at about 10 volts, its gate at 11 volts, and its drain at 21 volts. The gate to drain voltage of N1 is 10 volts. N3 has its source at 0 volts, gate at 0 volts, and drain at 10 volts. The gate to drain voltage of N3 is therefore 10 volts. The N+ drain to P-substrate voltage of N3 is 10 volts. Since the circuit is symmetrical, the above voltages are the same for the other respective P-channel and N-channel devices when the input is inverted.

A typical low voltage P-channel device and a typical low voltage N-channel device would give the following electrical specifications:

| N-channel | gated diode breakdown - BVDN | 15 volts |
|---|---|---|
| | N+ drain to P-substrate breakdown - BVJN | 16 volts |
| P-channel | gated diode breakdown - BVDP | 15 volts |
| | P+ drain to n-well breakdown - BVJP | 16 volts |

As described in the above paragraph, the gate to drain voltages of P1–P4 and N1–N4 are below the gated diode breakdown voltages and, consequently breakdown does not occur. Further, the P+ drain to n-well voltages of P1–P4 and the N+ drain to P-substrate voltages of N3 and N4 are below the junction breakdown. Therefore, with respect to P-channel devices P1–P7 and N-channel devices N3–N5, only regular low voltage P-channel and N-channel devices are needed to perform the high voltage level shift.

Figure 3A:
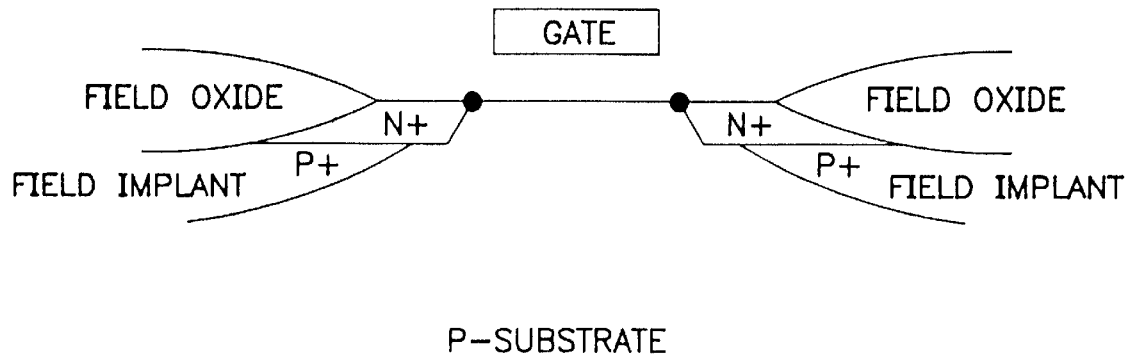
FIG. 3A is a cross section of the conventional NMOS.
Figure 3B:
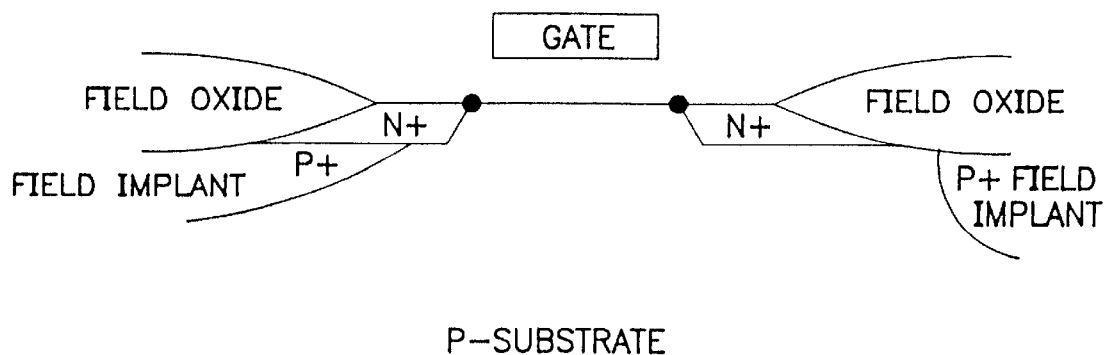
FIG. 3B is a cross section of the new NMOS.

However, with respect to N-channel devices N1 and N2, the voltage across the N+ drain to P-substrate junction is still 21 volts. Consequently, a low voltage N-channel device cannot be used because the drain voltage is about 5 volts above the maximum allowable voltage BVJN. In order to raise the junction breakdown voltage higher than 21 volts, a special layout technique is described. FIG. 3A shows a cross section of a conventional N-channel device. As is well known in the art, the junction breakdown of N+ drain to P-substrate depends on the doping level of the P-substrate. For a standard N-channel device of FIG. 3A, the boron field implant is used to increase the field threshold voltage of the poly silicon and metal interconnects over the field, but the boron field implant would diffuse underneath the N+ region, causing a lower junction breakdown voltage. FIG. 3B shows a cross section of the modified N-channel device of the present invention. To compensate for field implant diffusion, the field implant is pulled away from, or in the alternative, terminated short of, the N+ drain region. As a result, the N+ drain to P-substrate breakdown voltage is raised above the operating high voltage by a few tens of volts. Thus, the layout technique of the present invention satisfies the N+ drain to P-substrate junction voltage of 21 volts. In an alternative embodiment, the field implant may be pulled away from only the N+ source region or from both the N+ drain and source regions depending on the voltage across the device.

The advantage of the present invention over the prior art high voltage level shifter is that only regular low voltage P-channel and N-channel devices are necessary to perform a high voltage level shift. By adding a medium high voltage source, MHV, the very high voltage source, VHV, is distributed approximately equally among the series devices P2, P4, N1, and N3 or among the series devices P1, P3, N2, and N4. In addition, the maximum N+ drain to P-substrate voltage of devices N3–N4 and P+ drain to n-well voltage of devices P1–P6 is less than the breakdown voltage. Furthermore, with the layout technique of pulling the field implant away from the N+ drain region, i.e., terminating the field implant short of the N+ drain region, the N+ drain to P-substrate breakdown voltage of N-channel devices N1–N2 is increased to a few tens of volts. As a result, special high voltage P-channel and N-channel devices are not needed to perform a high voltage level shift.

It will also be apparent to one skilled in the art that in another embodiment of the present invention, the input high signal may be equal to VHV and the input low signal may be less than VHV, while the output swings between VHV and VSS. In this particular embodiment, the input signal, IN, and the inverse of the input signal, INB, are coupled to the gates of P-channel devices in the level shifter and the cross coupled connections are made to the gates of N-channel devices. Further extensions of the basic circuit can be obtained by increasing the number of cascaded P-channel and N-channel devices. In the preferred embodiment of FIG. 2, the high voltage, VHV, is divided across series devices P2 and P4 and N1 and N3, or across series devices P1 and P3 and N2 and N4. However, in another embodiment, the number of series devices and corresponding intermediate supply voltages may be increased to divide VHV across multiple series devices. This may become necessary if the gated diode voltages, BVDN and BVDP, are less than one half of the high voltage supply level, VHV.

Thus, while the preferred embodiment of the present invention has been disclosed and described herein, it will be understood by those skilled in the arts that various changes in form and detail may be made therein without departing from the spirit and scope thereof.

What is claimed is:

1. A high voltage complementary output level shifter using low voltage CMOS devices comprising:

a first terminal for coupling to a first voltage source, a second terminal for coupling to a second voltage source, and a third terminal for coupling to a third voltage source, wherein said second voltage source is intermediate to said first and third voltage sources;

first, second, third and fourth devices of a first conductivity type each having a source, a drain and a gate, said sources of said first and second devices being coupled to said first terminal, and said drains of said first and second devices being coupled to said sources of said third and fourth devices respectively;

fifth, sixth, seventh and eighth devices of a second conductivity type each having a source, a drain and a gate, said gates of said third, fourth, fifth and sixth devices being coupled to said second terminal, said sources of said seventh and eighth devices being coupled to said third terminal, said sources of said fifth and sixth devices being coupled to said drains of said seventh and eighth devices respectively, said drain of said sixth device being coupled to said drain of said fourth device and said gate of said first device, and said drain of said fifth device being coupled to said drain of said third device and said gate of said second device;

a first output terminal coupled to said gate of said first device and said drain of said fourth device, said first output terminal providing a first output signal;

a second output terminal coupled to said gate of said second device and said drain of said third device, said second output terminal providing a second output signal that is complementary to said first output signal; and first and second resistors, said fight resistor being coupled between said drain of said first device and said source of said third device, and said second resistor being coupled between said drain of said second device and said source of said fourth device.

2. The high voltage complementary output level shifter of claim 1 further comprising an input circuit coupled to said gates of said seventh and eighth devices respectively.

3. The high voltage complementary output level shifter of claim 2 wherein said input circuit is comprised of an inverter for inverting an input signal and coupling said input signal and an inverted input signal to said gates of said seventh and eighth devices respectively.

4. The high voltage complementary output level shifter of claim 3 further comprising a third output terminal and a fourth output terminal coupled to said sources of said third and fourth devices respectively.

5. The high voltage complementary output level shifter of claim 3 further comprising first and second diodes each having an anode and a cathode, said anodes of said first and second diodes being coupled to said second terminal, and said cathodes of said first and second diodes being coupled to said sources of said third and fourth devices respectively for stabilizing a first voltage and a second voltage at said sources of said third and fourth devices respectively.

6. The high voltage complementary output level shifter of claim 3 further comprising ninth and tenth devices of said first conductivity type each having a source, a drain and a gate, said ninth and tenth devices being coupled to said third and fourth devices respectively for stabilizing a first voltage and a second voltage at said sources of said third and fourth devices respectively.

7. The high voltage complementary output level shifter of claim 1 wherein said devices of said first conductivity type are comprised of p-channel field effect devices having an n-well region, and said devices of said second conductivity type are comprised of n-channel field effect devices having a p-substrate region.

8. The high voltage complementary output level shifter of claim 1 wherein said first voltage source is approximately 21 volts and wherein said third voltage source is approximately 0 volts.

9. The high voltage complementary output level shifter of claim 1 wherein said fifth and sixth devices have a field implant terminating short of said drain region.

10. In a circuit having a plurality of devices, a method of distributing a voltage among series devices of opposite conductivity types, the method comprising the steps of;

a) providing a first terminal for coupling to a first voltage source, a second terminal for coupling to a second voltage source, and a third terminal for coupling to a third voltage source, wherein said second voltage source is intermediate to said first and third voltage sources;

b) providing first, second, third and fourth devices of a first conductivity type, each device having a source, a drain and a gate, coupling said sources of said first and second devices to said first terminal, and coupling said drains of said first and second devices to said sources of said third and fourth devices respectively;

c) providing fifth, sixth, seventh and eighth devices of a second conductivity type each having a source, a drain and a gate, coupling said gates of said third, fourth, fifth and sixth devices to said second terminal, coupling said sources of said seventh and eighth devices to said third terminal, coupling said sources of said fifth and sixth devices to said drains of said seventh and eighth devices respectively, coupling said drain of said sixth device to said drain of said fourth device and said gate of said first device, and coupling said drain of said fifth device to said drain of said third device and said gate of said second device;

d) providing an input circuit, and coupling said input circuit to said gates of said seventh and eighth devices for controlling said drain voltages of said fifth and sixth devices;

e) providing a first output terminal coupled to said gate of said first device and said drain of said fourth device, said first output terminal providing a first output signal;

f) providing a second terminal coupled to said gate of said second device and said drain of said third device, said second output terminal providing a second output signal that is complementary to said first output signal; and g) providing first and second resistors, coupling said first resistor between said drain of said first device and said source of said third device, and coupling said second resistor between said drain of said second device and said source of said fourth device.

11. The method of claim 10 wherein said input circuit is comprised of an inverter for inverting an input signal and coupling said input signal and an inverted input signal to said gates of said seventh and eighth devices respectively.

12. The method of claim 11 further comprising the step of providing a third output terminal and a fourth output terminal and coupling said third and fourth output terminals to said sources of said third and fourth devices respectively.

13. The method of claim 11 further comprising the step of providing first and second diodes each having an anode and a cathode, coupling said anodes of said first and second diodes to said second terminal, and coupling said cathodes of said first and second diodes to said sources of said third and fourth devices respectively for stabilizing a first voltage and a second voltage at said sources of said third and fourth devices respectively.

14. The method of claim 11 further comprising the step of providing ninth and tenth devices of said first conductivity type each having a source, a drain and a gate, and coupling said ninth and tenth devices to said third and fourth devices respectively for stabilizing a first voltage and a second voltage at said sources of said third and fourth devices respectively.

15. The method of claim 10 wherein said devices of said first conductivity type are comprised of p-channel field effect devices having an n-well region, and said devices of said second conductivity type are comprised of n-channel field effect devices having a p-substrate region.

16. The method of claim 10 wherein said first voltage source is approximately 21 volts and wherein said third voltage source is approximately 0 volts.

17. The method of claim 10 wherein, in step c), the field implant is terminated short of said drain region of said fifth and sixth devices.

18. A high voltage complementary output level shifter using low voltage CMOS devices comprising:
  a first terminal for coupling to a first voltage source, a second terminal for coupling to a second voltage source, and a third terminal for coupling to a third voltage source, wherein said second voltage source is intermediate to said first and third voltage sources;
  first, second, third and fourth devices of a first conductivity type each having a source, a drain and a gate, said sources of said first and second devices being coupled to said first terminal, and said drains of said first and second devices being coupled to said sources of said third and fourth devices respectively;
  fifth, sixth, seventh and eighth devices of a second conductivity type each having a source, a drain and a gate, said gates of said third, fourth, fifth and sixth devices being coupled to said second terminal, said sources of said seventh and eighth devices being coupled to said third terminal, said sources of said fifth and sixth devices being coupled to said drains of said seventh and eighth devices respectively, said drain of said sixth device being coupled to said drain of said fourth device and said gate of said first device, and said drain of said fifth device being coupled to said drain of said third device and said gate of said second device;
  a first output terminal coupled to said source of said third device, said first output terminal providing a first output signal;
  a second output terminal coupled to said source of said fourth device, said second output terminal providing a second output signal that is complementary to said first output signal; and
  first and second resistors, said first resistor being coupled between said drain of said first device and said source of said third device, and said second resistor being coupled between said drain of said second device and said source of said fourth device.

19. The high voltage complementary output level shifter of claim 18 further comprising an input circuit coupled to said gates of said seventh and eighth devices respectively.

20. The high voltage complementary output level shifter of claim 19 wherein said input circuit is comprised of an inverter for inverting an input signal and coupling said input signal and an inverted input signal to said gates of said seventh and eighth devices respectively.

21. The high voltage complementary output level shifter of claim 20 further comprising first and second diodes each having an anode and a cathode, said anodes of said first and second diodes being coupled to said second terminal, and said cathodes of said first and second diodes being coupled to said sources of said third and fourth devices respectively for stabilizing a first voltage and a second voltage at said sources of said third and fourth devices respectively.

22. The high voltage complementary output level shifter of claim 20 further comprising ninth and tenth devices of said first conductivity type each having a source, a drain and a gate, said ninth and tenth devices being coupled to said third and fourth devices respectively for stabilizing a first voltage and a second voltage at said sources of said third and fourth devices respectively.

23. The high voltage complementary output level shifter of claim 18 wherein said devices of said first conductivity type are comprised of p-channel field effect devices having an n-well region, and said devices of said second conductivity type are comprised of n-channel field effect devices having a p-substrate region.

24. The high voltage complementary output level shifter of claim 18 wherein said first voltage source is approximately 21 volts and wherein said third voltage source is approximately 0 volts.

25. In a circuit having a plurality of devices, a method of distributing a voltage among series devices of opposite conductivity types, the method comprising the steps of:
  a) providing a first terminal for coupling to a first voltage source, a second terminal for coupling to a second voltage source, and a third terminal for coupling to a third voltage source, wherein said second voltage source is intermediate to said first and third voltage sources;
  b) providing first, second, third and fourth devices of a first conductivity type, each device having a source, a drain and a gate, coupling said sources of said first and second devices to said first terminal, and coupling said drains of said first and second devices to said sources of said third and fourth devices respectively;
  c) providing fifth, sixth, seventh and eighth devices of a second conductivity type each having a source, a drain and a gate, coupling said gates of said third, fourth, fifth and sixth devices to said second terminal, coupling said sources of said seventh and eighth devices to said third terminal, coupling said sources of said fifth and sixth devices to said drains of said seventh and eighth devices respectively, coupling said drain of said sixth device to said drain of said fourth device and said gate of said first device, and coupling said drain of said fifth device to said drain of said third device and said gate of said second device;

d) providing an input circuit, and coupling said input circuit to said gates of said seventh and eighth devices for controlling said drain voltages of said fifth and sixth devices;

e) providing a first output terminal coupled to said source of the third device, said first output terminal providing a first output signal;

f) providing a second output terminal coupled to said source of the fourth device, said second output terminal providing a second output signal that is complementary to said first output signal; and g) providing first and second resistors, coupling said first resistor between said drain of said first device and said source of said third device, and coupling said second resistor between said drain of said second device and said source of said fourth device.

26. The method of claim 25 wherein said input circuit is comprised of an inverter for inverting an input signal and coupling said input signal and an inverted input signal to said gates of said seventh and eighth devices respectively.

27. The method of claim 26 further comprising the step of providing first and second diodes each having an anode and a cathode, coupling said anodes of said first and second diodes to said second terminal, and coupling said cathodes of said first and second diodes to said sources of said third and fourth devices respectively for stabilizing a first voltage and a second voltage at said sources of said third and fourth devices respectively.

28. The method of claim 26 further comprising the step of providing ninth and tenth devices of said first conductivity type each having a source, a drain and a gate, and coupling said ninth and tenth devices to said third and fourth devices respectively for stabilizing a first voltage and a second voltage at said sources of said third and fourth devices respectively.

29. The method of claim 25 wherein said devices of said first conductivity type are comprised of P-channel field effect devices having an n-well region, and said devices of said second conductivity type are comprised of n-channel field effect devices having a p-substrate region.

30. The method of claim 25 wherein said first voltage source is approximately 21 volts and wherein said third voltage source is approximately 0 volts.

* * * * *

UNITED STATES PATENT AND TRADEMARK OFFICE
CERTIFICATE OF CORRECTION

PATENT NO.    : 6,437,627 B1
DATED         : August 20, 2002
INVENTOR(S)   : Hieu Van Tran and Trevor Blyth It is certified that error appears in the above-identified patent and that said Letters Patent is hereby corrected as shown below:

<u>Title page, Item [54] and Column 1, line 3,</u>
Delete "INTERGRATED" and insert -- INTEGRATED --.

<u>Column 5,</u>
Line 57, delete "fight" and insert -- first --.

<u>Column 7,</u>
Line 1, "f) providing a second terminal coupled to said gate of said" should be
-- f) providing a second output terminal coupled to said gate of said --.

Signed and Sealed this

Twenty-sixth Day of August, 2003

JAMES E. ROGAN
*Director of the United States Patent and Trademark Office*